(12) United States Patent
Kozlovsky et al.

(10) Patent No.: US 7,120,178 B2
(45) Date of Patent: Oct. 10, 2006

(54) CHIP CARRIER APPARATUS AND METHOD

(75) Inventors: William J. Kozlovsky, Sunnyvale, CA (US); Andrew Daiber, Palo Alto, CA (US); Kevin Sawyer, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/173,545

(22) Filed: Jun. 15, 2002

(65) Prior Publication Data

US 2003/0231669 A1 Dec. 18, 2003

(51) Int. Cl.
*H01S 3/04* (2006.01)

(52) U.S. Cl. ...................... 372/36; 372/43.01; 372/50.1

(58) Field of Classification Search ................ 372/109, 372/101, 34, 43–50, 107; 257/730, 777, 257/778, 712, 99, 713
See application file for complete search history.

(56) References Cited

U.S. PATENT DOCUMENTS

| | | | | |
|---|---|---|---|---|
| 5,436,920 A | * | 7/1995 | Minemoto et al. ............. | 372/21 |
| 5,745,625 A | * | 4/1998 | Aikiyo et al. ................. | 385/94 |
| 6,125,132 A | * | 9/2000 | Okazaki ...................... | 372/75 |
| 6,235,557 B1 | * | 5/2001 | Manley ....................... | 438/132 |
| 6,289,029 B1 | * | 9/2001 | Goto et al. ................... | 372/32 |
| 6,310,900 B1 | * | 10/2001 | Stephens et al. ............... | 372/36 |
| 6,323,990 B1 | * | 11/2001 | Yamamoto et al. ......... | 359/328 |
| 6,490,309 B1 | * | 12/2002 | Okazaki et al. ................ | 372/75 |
| 6,522,486 B1 | * | 2/2003 | Furuhashi et al. .......... | 359/819 |
| 6,524,016 B1 | * | 2/2003 | Ohki et al. .................... | 385/88 |
| 6,526,071 B1 | * | 2/2003 | Zorabedian et al. .......... | 372/20 |
| 6,568,864 B1 | * | 5/2003 | Ishimaru ...................... | 385/93 |
| 6,678,432 B1 | * | 1/2004 | Shigeta et al. ................ | 385/14 |
| 6,724,797 B1 | * | 4/2004 | Daiber ........................ | 372/92 |
| 6,736,553 B1 | * | 5/2004 | Stiehl et al. ................... | 385/89 |
| 6,763,047 B1 | * | 7/2004 | Daiber et al. .................. | 372/34 |
| 6,788,724 B1 | * | 9/2004 | Sell et al. ...................... | 372/92 |
| 6,822,996 B1 | * | 11/2004 | Pace et al. ................... | 372/109 |
| 6,845,121 B1 | * | 1/2005 | McDonald ................... | 372/34 |
| 2003/0007539 A1 | * | 1/2003 | Sell et al. ..................... | 372/92 |
| 2003/0007540 A1 | * | 1/2003 | Daiber ........................ | 372/92 |
| 2004/0135876 A1 | * | 7/2004 | Ueda et al. .................. | 347/238 |

* cited by examiner

*Primary Examiner*—Minsun O. Harvey
*Assistant Examiner*—Delma R. Flores-Ruiz
(74) *Attorney, Agent, or Firm*—Blakely, Sokoloff, Taylor & Zafman LLP

(57) ABSTRACT

A chip carrier having improver thermal properties, wherein the chip carrier may be formed having waist section, and a first transverse end portion joined to the waist section. A first surface of the carrier being configured to receive a chip thereon, and a second surface of the carrier configured to be coupled to a thermal control unit to provide cooling of the carrier and chip. The chip carrier may have a second transverse end portion joined to the waist portion in certain embodiments.

17 Claims, 9 Drawing Sheets

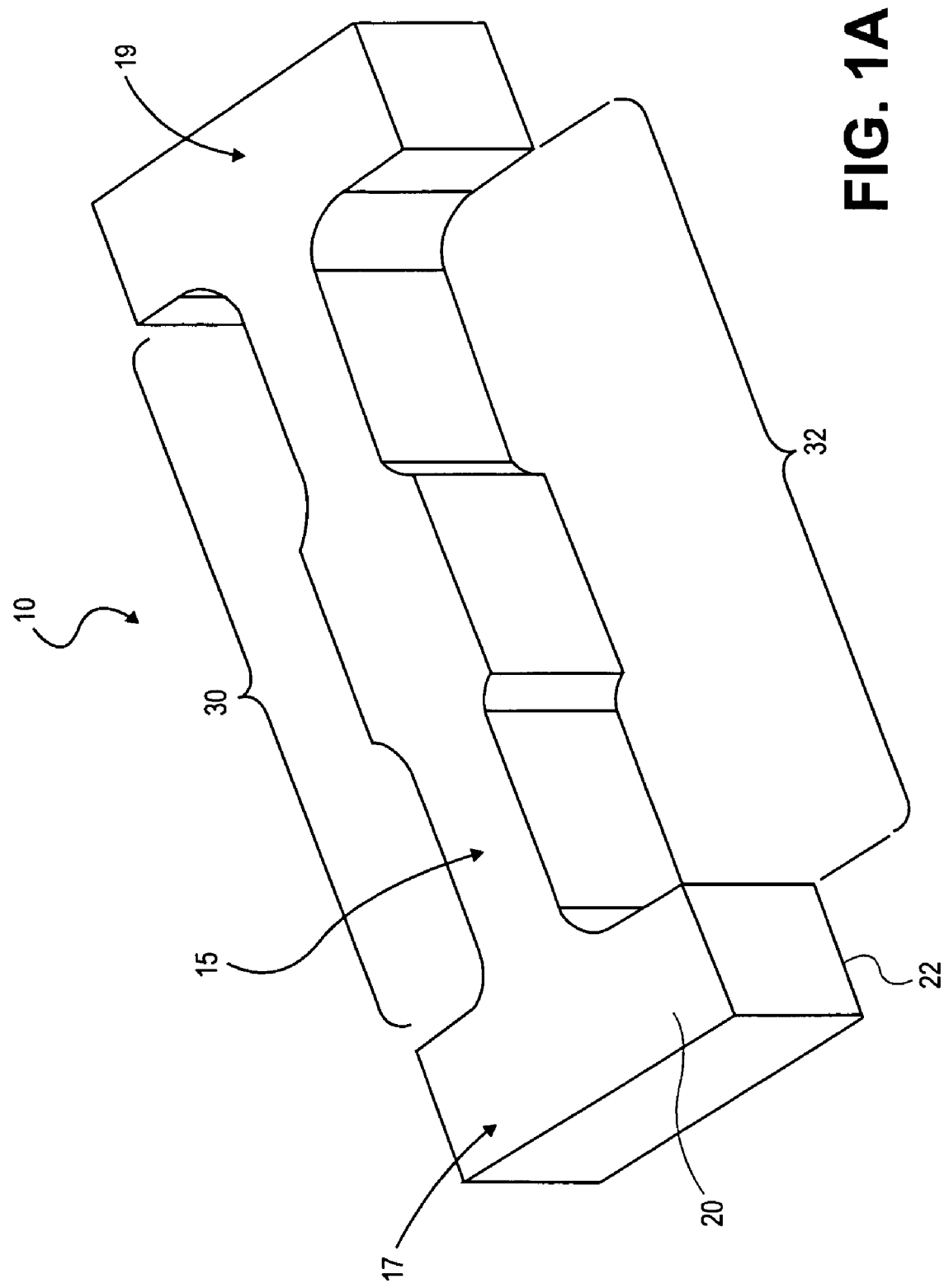

CHIP CARRIER APPARATUS AND METHOD

BACKGROUND OF THE INVENTION

There is an increasing demand for tunable lasers for test and measurement uses, wavelength characterization of optical components, fiberoptic networks and other applications. In dense wavelength division multiplexing (DWDM) fiberoptic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overcome the limitations of individual DFB devices. Various laser tuning mechanisms have been developed to provide external cavity wavelength selection, such as mechanically tuned gratings used in transmission and reflection. External cavity lasers must be able to provide a stable, single mode output at selectable wavelengths while effectively suppress lasing associated with external cavity modes that are within the gain bandwidth of the cavity. These goals have been difficult to achieve, and there is accordingly a need for an external cavity laser that provides stable, single mode operation at selectable wavelengths.

Temperature control of emitter chips may be employed in laser devices cool the emitter chips during laser operation. Prior art diode or emitter chip carriers have not been configured for effective heat transfer between the chip and a thermal control source such as a thermoelectric controller or TEC to maintain the chip at an optimal temperature. Typically, the carriers used have a generally square or rectangular shape, with the diode chip mounted on the top of the block-shaped carrier. This type of chip carrier system results in many shortcomings. For example, the square/rectangular shape of the carrier has poor thermal control properties. Particularly, a simple rectangular carrier provides poor heat flow properties, with heat flows occurring primarily in a vertical direction, thus limiting the ability of the rectangular carrier to dissipate heat. As a result of poor heat flow, localized heating on the upper surface of the carrier may occur, which may interfere with the thermal control of the diode chip during and after operation. Diode chips are subject to temperature control during operation to maintain a desired output, and if a desired temperature cannot be maintained, desired output may not be achieved.

Additionally, a simple rectangular carrier can physically hinder the close placement of collimating lenses to the diode chip, therefore requiring the collimating lenses to be positioned at a distance from the diode chip. Positing the collimating lenses further away to accommodate the carrier results in an overall increase of the size of the external cavity diode laser (ECDL), which is undesirable in many applications. Narrowing the width of the carrier to allow closer positioning of the collimating lenses to the diode can overcome this problem. This approach, however, creates a further problem of restricting the thermal conduction path to the heatsink and exacerbates the thermal control problem. In addition, it creates a carrier that may be easily tipped over during assembly (before it is bonded to the TEC or other substrate), therefore making it difficult to handle during assembly. This leads to additional care needed in handling the narrow carrier during assembly, which then leads to increased manufacturing costs of the laser.

Therefore there is a need for a carrier that provides good heat transfer capabilities, that allows the collimating lenses to be placed close to the diode to provide a compact and efficient overall package, and which is easy to handle during manufacturing and assembly. The present invention satisfies these needs, as well as others, and overcomes the deficiencies found in the prior art.

BRIEF DESCRIPTIONS OF THE DRAWINGS

FIG. 1A is a perspective view of a first embodiment of a chip carrier apparatus in accordance with the present invention;

DETAILED DESCRIPTION OF THE INVENTION

Figure 1B:
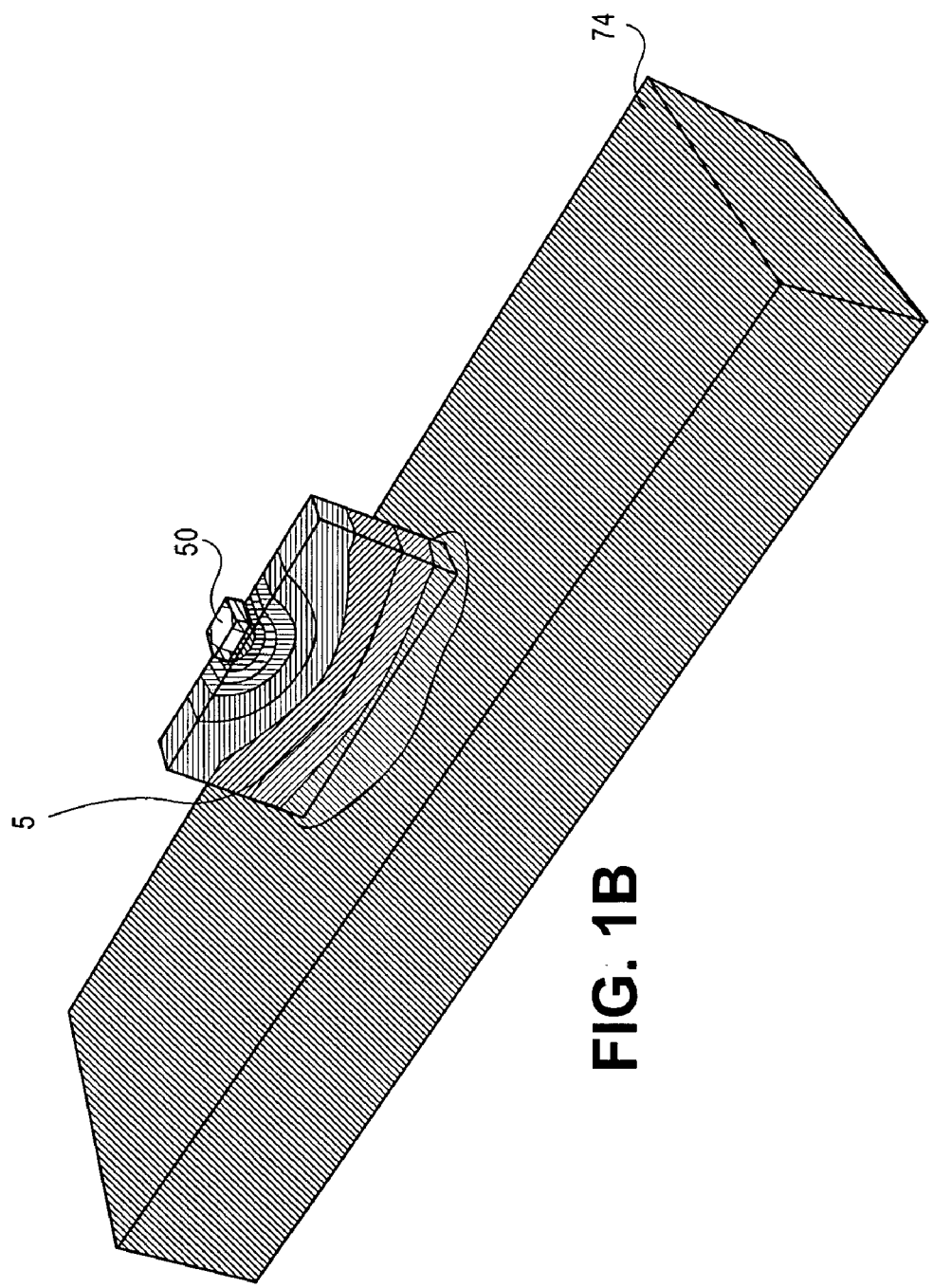
FIG. 1B is a perspective view of a rectangular chip carrier illustrating heat transfer therethrough.
Figure 1B:
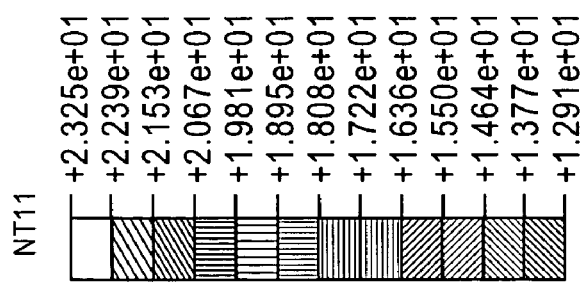

The present invention relates to chip carrier devices and external cavity laser chip carrier devices and methods of use. In accordance with the invention there is provided a laser gain medium carrier. The laser gain medium carrier includes a waist section; a first, transverse end portion joined to the waist section; a first surface configure to support a chip; and, a second surface configured to couple to a thermal control element.

In accordance with the present invention, there is provided a laser apparatus, the laser apparatus including a gain medium; and a carrier for the gain medium, the carrier including a waist section, a first, transverse end portion joined to the waist section, a first surface configured to support the gain medium, and a second surface configured to couple to a thermal control element.

In accordance with yet another embodiment there is provided a carrier, the carrier being constructed of a material having good heat transfer properties, wherein the carrier is formed in the shape of a "dog bone" thereby allowing the collimating lenses to be placed closer to the diode, thereby reducing the overall size of the ECDL package.

In accordance with the present invention there is provided a carrier that is configured to provide improved heat flow between the diode chip and the TEC, and provide good stability during assembly, and allow the collimating optics to be placed as close as possible (within focal length limitations of the collimators) to the diode chip. These advantages are achieved by (a) a "T-Bone" shaped carrier and a (b) "Dog-Bone" shaped carrier.

In accordance with the present invention, there also provided a laser apparatus comprising a gain medium chip and a carrier for the chip, the carrier including a waist section, a first, transverse end portion joined to the waist section, a first surface configure to support the gain medium, and a second surface configured to couple to a thermal control element. The apparatus may further comprise a first arcuate side, and a first collimator lens located adjacent the first side and configured to collimate a first light beam emitted from a first output facet of the chip. The apparatus may additionally comprise a second arcuate side, and a second collimator lens located adjacent the second side and configured to collimate a second light beam emitted from a second output facet of the chip. The apparatus may further comprise a wavelength selection element positioned in the first light beam after the first collimator, a reflective element positioned in the first light beam after the wavelength selection element and/or an optical isolator positioned in the second light beam after the second collimator. In certain embodiments, the chip carrier may also comprise a second transverse end portion joined to the waist section.

In accordance with the present invention, there is also provided a method of laser operation, comprising providing chip carrier having a waist section, and a first, transverse end portion joined to the waist section, the chip carrier comprising a thermally conductive material, mounting a gain medium chip on a first surface of the chip carrier, and emitting a beam from a facet of the gain medium chip. The methods may further comprise controlling temperature of the gain medium chip via thermal conduction through the chip carrier. The controlling of the temperature of the gain medium chip may further comprise mounting a second surface of the chip carrier onto a thermally conductive substrate, and coupling the thermally conductive substrate to a thermoelectric controller. The methods comprise, in certain embodiments, positioning a wavelength selection element in the beam, and feeding back light of a selected wavelength to the gain medium chip.

Referring more specifically to the drawings, for illustrative purposes the present invention is embodied in the apparatus shown in FIG. 1 through FIG. 8. It will be appreciated that the apparatus may vary as to configuration and as to details of the parts, and that the method may vary as to details and the order of the acts, without departing from the basic concepts as disclosed herein. The invention is disclosed primarily in terms of use with an external cavity diode laser. The invention, however, may be used with various types of laser devices and optical systems. The relative sizes of components and distances therebetween as shown in the drawings are in many instances exaggerated for reason of clarity, and should not be considered limiting. Any definitions herein are provided for reason of clarity, and should not be considered as limiting, and any technical and scientific terms used herein are intended to have the same meaning as commonly understood by those skilled in the art.

It should also be understood that the terminology used herein is for the purpose of describing particular embodiments only, and is not intended to be limiting, since the scope of the present invention will be limited only by the appended claims.

In accordance with the present invention there is provided a carrier for integrated circuit chips such as laser diode chips and bent waveguide diode chips, wherein the carrier is configured to provide improved heat flow between the chip and TEC, and provide good stability during assembly, and allow the collimating optics to be placed a close as possible (within focal length limitations of the collimators) to the diode chip. These advantages are achieved by a "Dog-Bone" and a "T-Bone" shaped carrier, as will be described in detail below.

Referring now to FIG. 1A, there is shown a chip carrier apparatus 10 in accordance with the present invention. As shown in FIG. 1A, the carrier 10 is defined by a waist section 15, and first and second transverse end portions 17, 19, resulting in a generally "Dog-Bone" shape. The carrier 10 further includes a first surface 20 and a second surface 22, wherein the first surface 20 is configured to retain a chip (not shown) such as a laser diode chip, and the second surface is configured to be coupled to a thermal control element such as a TEC (also not shown). As shown in FIG. 1A, the carrier 10 further includes first and second arcuate portions 30 and 32, wherein the first and second arcuate portions 30, 32 are each configured to accommodate a collimator lens (not shown).

The carrier 10 may be constructed of any materials having good thermal conductivity, and may be made from materials having selected heat transfer properties. For example the carrier 10 may be constructed of materials such as aluminum, steel, brass, titanium, metal oxide, metal nitride, metal carbide, or alloys or blends, mixtures or composites thereof. In certain embodiments the carrier is constructed copper tungsten (CuW) alloy. The material of carrier 10 may also be selected to be matched in coefficient of thermal expansion CTE to other components (not shown) that may be bonded to carrier 10 as described below. It should be understood that the list of materials above is merely exemplary and is not be considered limiting in any manner, in that other materials not listed above may be utilized in the construction of the carrier in accordance with the present invention as would be apparent to one skilled in the art. The carrier 10 may be constructed of any material with selected thermal conductivity properties suitable for the application.

The carrier 10 may be constructed utilizing known manufacturing methods such as casting, molding, extruding, or machining. The carrier 10 may have a machined first surface 20 and a machined second surface 22. Machining the first and second surfaces ensures that the diode will be received in a substantially level manner, thereby facilitating optical alignment. The second surface 22 may also be machined to ensure that the bottom of the carrier sits flat against a support or substrate (not shown) as described below, to achieve maximum thermal conductivity between carrier 10 and the substrate. Additionally, as described above the top and bottom surfaces 20, 22 of the carrier 10 may include geometric features that are configured to enhance heat transfer between components.

Referring now to FIG. 1B the heat flow characteristics of a simple rectangular chip carrier is illustrated by the thermal gradients shown. As shown in FIG. 1B, the chip 50 has been brought up to an operating temperature and held constant at that temperature. As shown by the thermal gradient lines, the chip carrier 5 becomes saturated with heat, thereby hindering the ability of the chip carrier to transfer heat to the substrate 74. Thus, it would be difficult to maintain a constant temperature of the chip 50 because relatively little heat transfer takes place between the chip carrier 5 and the substrate 74 as shown in FIG. 1B.

Figure 1C:
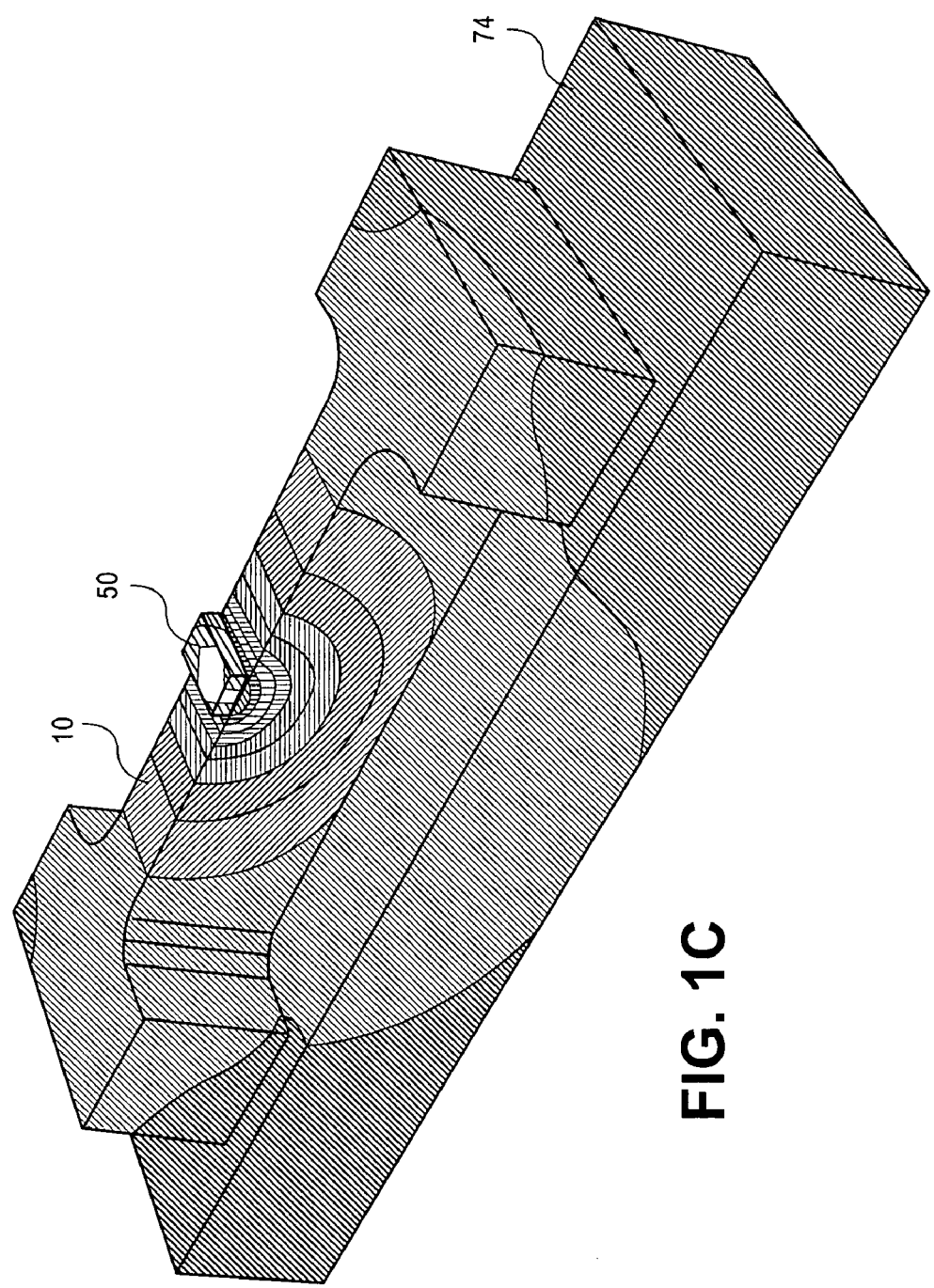
FIG. 1C is a perspective view of the chip carrier of FIG. 1 illustrating heat transfer therethrough.
Figure 1C:
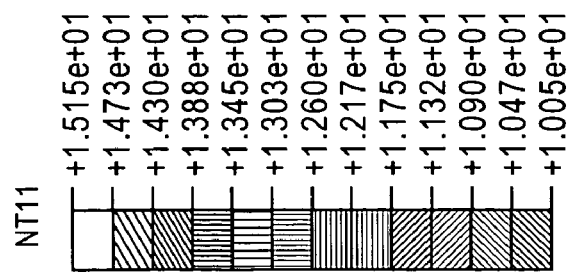

Referring now to FIG. 1C, there is shown an exemplary embodiment of the carrier 10 in accordance with the present invention. As shown in FIG. 1C the chip 50 is being held at a constant operating temperature. As shown by the thermal gradient lines, it can be seen that the carrier 10 provides improved heat transfer between the chip 50, carrier 10 and substrate 74. The improved heat transfer of the carrier 10 therein provides control over the operating temperature of the chip 50 and temperature changes of the chip 50, the advantages of which will be described in greater detail below.

Figure 2:
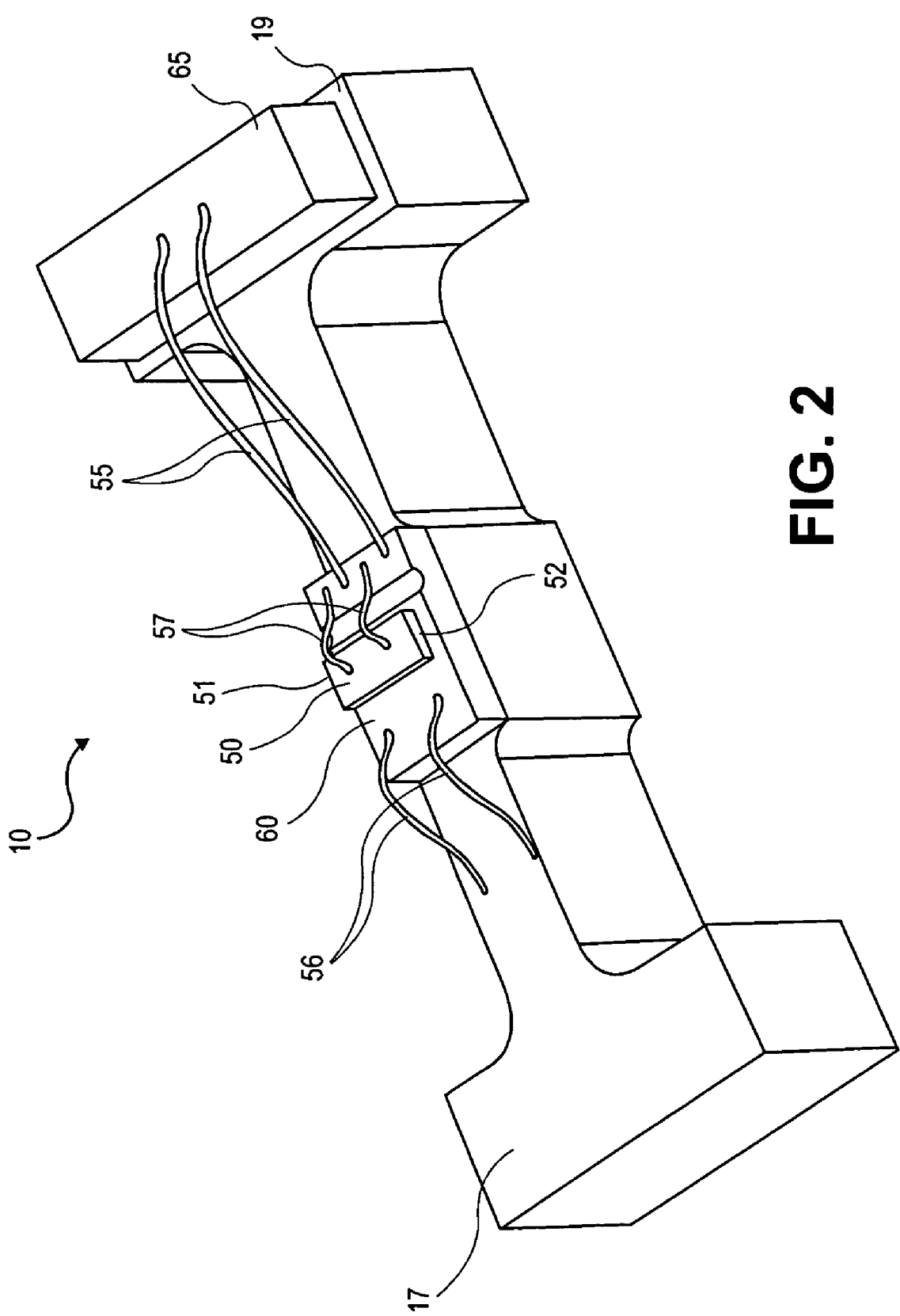
FIG. 2 is a perspective view of the chip carrier apparatus of FIG. 1 illustrating a chip attached thereto.

As shown in FIG. 2, the carrier 10 further includes a first bonding pad 60, wherein the first bonding pad 60 is configured to receive a chip 50 as shown. The carrier 10 further includes at least one second bonding pad 65 disposed at one end of the carrier 10. The bonding pad 65 is coupled to the first bonding pad 60 with at least one electrical lead 55 as shown. Additional electrical leads 57 couple the first bonding pad 60 and the chip 50. Leads 56 couple the first bonding pad 60 to an electrode (not shown) on the bottom surface of the chip 50, to allow delivery of a drive current to chip 50 in a conventional manner. Leads 55, 56, 57 communicate with a suitable power source (not shown) to allow application of electrical power to chip 50. It should be understood that the list of specific electrical lead connections above is merely exemplary and is not be considered limiting in any manner, in that other electrical lead connections not listed above may be utilized in the construction of the carrier in accordance with the present invention as would be apparent to one skilled in the art. Bonding pads 60, 65 may comprise any insulating material, and in many embodiments may comprise thermally conductive insulator materials to facilitate heat transfer between chip 50 and carrier 10. The material of bonding pads may also be selected based on CTE considerations. Various metal nitrides, carbides and oxides are suitable for use as bonding pad materials, and aluminum nitride may be used in many embodiments.

The chip 50 may be any chip that can benefit from thermal heating or cooling or thermal control generally. For example, the chip 50 may be a central processing unit (CPU), a memory chip, a diode emitting chip or gain medium such as distributed feedback device (DFB distributed Bragg reflector (DBR) device, a vertical cavity surface emitting diode, or other chip device that may be subject to thermal control during operation. In many embodiments the chip 50 is a DFB diode chip having emission facets 51 and 52 disposed on either side of the chip. As shown in FIG. 2, the chip 50 may be coupled to first bonding pad 60, and the bonding pad 60 is coupled to the first surface 20 of the carrier 10. The chip 50 may be coupled to the bonding pad 60 utilizing bonding means such as glues, adhesives, solder or similar means. The bonding pads 60, 65 and the chip 50 may be bonded using a thermally conductive adhesive or solder which may be matched in CTE according to each particular component as described further below.

Additionally, the carrier 10 is configured such that the chip 50 may be mounted in any position orientation to carrier 10. For example, the chip may be mounted right-side up as shown in FIG. 2, or alternatively, the chip may be inverted and mounted upside down adjacent the first surface 20 of the carrier 10 (not shown).

Figure 3:
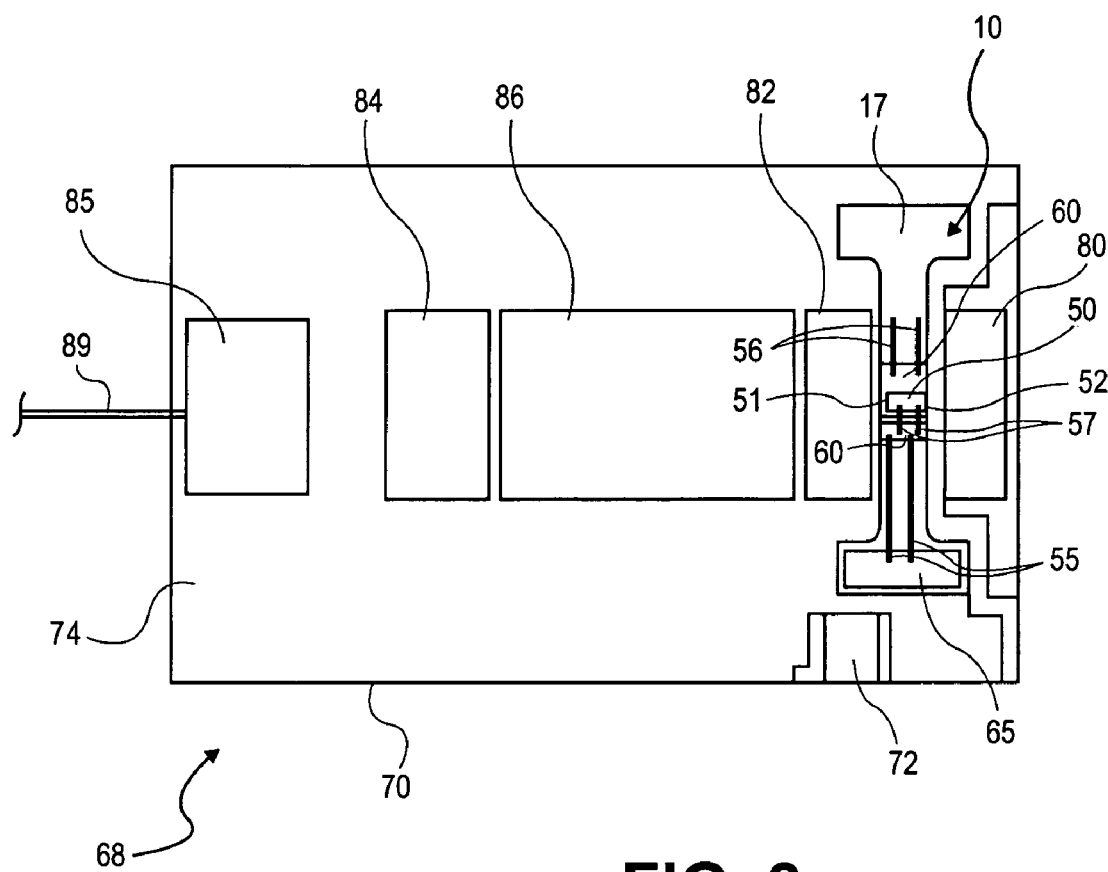
FIG. 3 is a top plan view of the chip carrier and diode chip of FIG. 2 shown on a common platform with an optical output assembly.

Referring now to FIG. 3 there is shown a laser output assembly apparatus 68 in accordance with the invention, with like reference numbers denoting like parts. As shown in FIG. 3, the apparatus includes a thermal control element or module 70. The thermal control module 70 allows for the placement of chip 50, carrier 10 and various laser output optical elements on a common substrate 74. The apparatus comprises a chip 50 with output facets 51 and 52 mounted on carrier 10, collimator lenses 80 and 82, fiber focusing lens 84, a fiber-supporting ferrule 85, an optical isolator 86, and an optical fiber 89. Chip facets 51 and 52, as well as the surfaces of the collimators 80 and 82 and the lens 84, present several of the more important alignment-sensitive optical surfaces of the apparatus 68, and the inclusion of all of these components onto a single thermally controlled substrate 74 allows easy assembly and alignment of the components, and collective temperature control of the components to prevent optical alignment problems due to thermal miss-registration.

The substrate 74 comprises a thermally conductive material, and is bonded to a thermoelectric controller 70 (positioned beneath substrate). The temperature of substrate 74 is monitored via a thermistor 72, and provides thermal control of substrate 74, and hence carrier 10 and the gain medium 50, collimators 80, 82, fiber focusing lens 84, ferrule 85 and optical isolator 86 components on substrate. Chip facets 51 and 52, as well as the surfaces of collimators 80, 82 and fiber focusing lens 84, present several of the more important alignment-sensitive optical surfaces of the output apparatus 68, and the inclusion of all of these components onto a single thermally controlled substrate 74 allows collective temperature control of the components to prevent optical alignment problems due to thermal mis-registration. The mounting of laser output components on a common substrate in this manner is also described in U.S. patent application Ser. No. 09/900,429, filed Jul. 6, 2001, the disclosure of which is incorporated herein by reference.

The fiber ferule 85, fiber focusing lens 84, collimators 80, and 82, optical isolator 86 and carrier 10 preferably are mounted or joined to substrate 74 by a thermally conductive adhesive or solder, which may be CTE-matched to each particular component. Alternatively, the carrier may be mounted or joined to the substrate utilizing a high thermally conductive adhesive, while the remaining components may be mounted or joined with a low thermal conductive adhesive. Chip 50 is joined to the first bonding pad 60 in a similar manner with a thermally conductive adhesive or solder that may be CTE-matched to chip 50 and first bonding pad 60. The first bonding pad 60, fiber ferule 85, collimators 80, 82 may be structured and configured in a manner that promotes thermal contact with substrate 74. Substrate 74 may likewise include grooves, recesses, or other surface features (not shown), which are configured to optimize thermal contact with the aforementioned components. Various other thermal control considerations known to those skilled in the art may be used in the carrier 10, fiber ferule 85, and collimators 80, 82 to substrate 74, for coupling substrate 74 to the thermoelectric controller 70, and for coupling thermistor 72 to substrate 74 and thermoelectric controller 70.

The elongated waist section 15 and first and second transverse end portions 17, 19 of carrier 10 provide a shape that is easily handled during assembly of the apparatus 70, and provide a surface 22 of relatively large area for good thermal coupling to substrate 74. The arcuate or curvilinear portions 30, 32 of carrier 10 allow close positioning of collimators 80, 82 to chip 50, and allow a reduction in size of the overall apparatus 70. Carrier 10 may be configured to allow collimators to be positioned as close to chip 50 as possible within the limitations of focal length and numerical aperture considerations.

Figure 4:
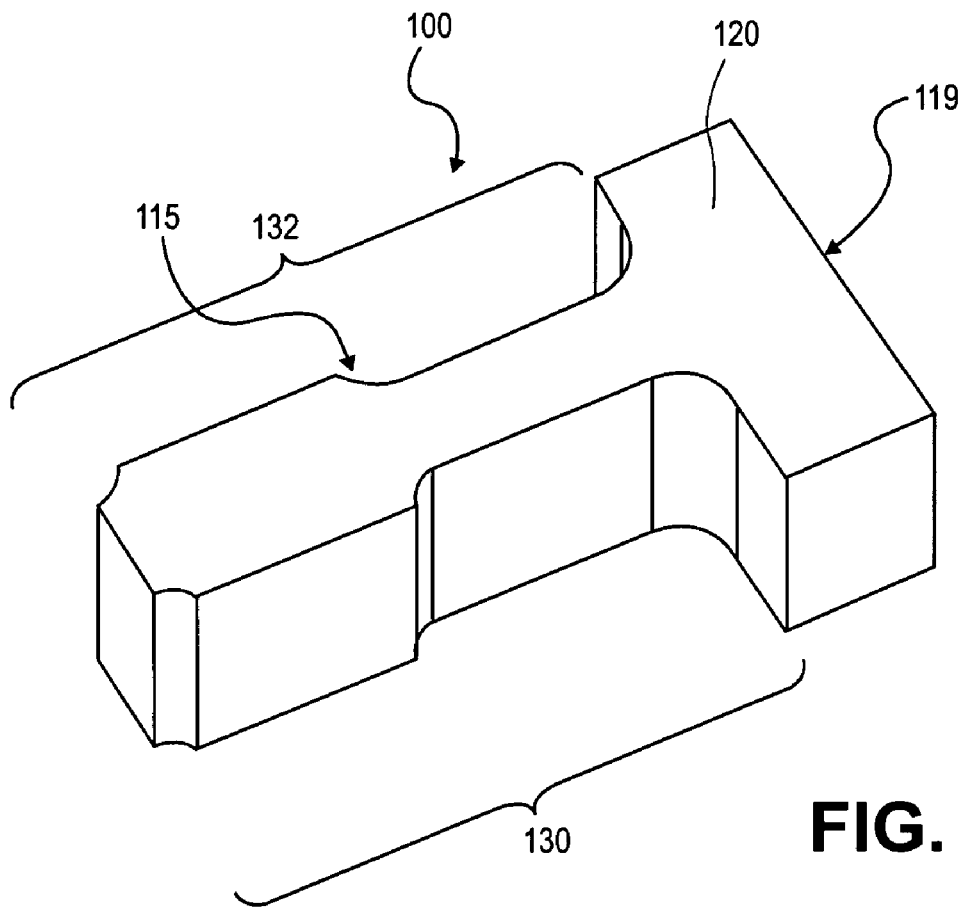
FIG. 4 is a perspective view of another embodiment of a chip carrier in accordance with the invention.

Referring now to FIG. 4 there is shown an alternative embodiment of a carrier apparatus 100 in accordance with the present invention. As shown in FIG. 4, the carrier 100 comprises a generally "T-Bone" shape, the T-Bone shape defined by an elongated waist section 115 and a single transverse end portion 119, with a top surface 120 configured to support a chip thereon, and a bottom surface configured to be coupled to a thermal control element such as a TEC or a thermally conductive substrate associated with a TEC as described above. The carrier 100 further includes arcuate side areas or portions 130 and 132 that are configured to accommodate collimator lenses (not shown).

Figure 5:
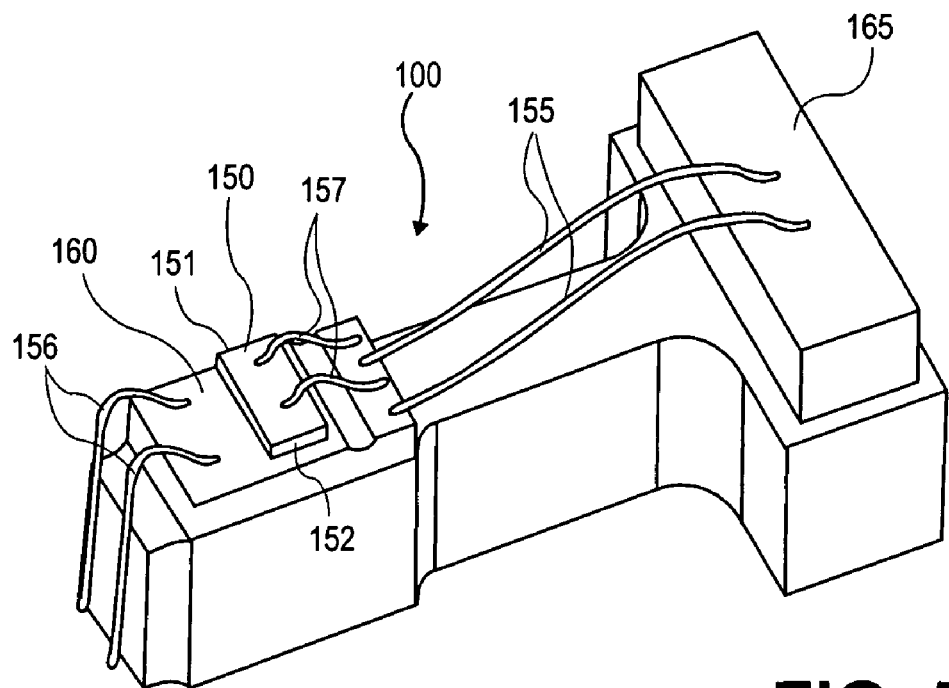
FIG. 5 is a perspective view of the chip carrier apparatus of FIG. 4 shown with a bent waveguide diode chip attached thereto.

As shown in FIG. 5, the carrier 100 includes a first bonding pad 160 and second bonding pad 165, wherein the first bonding pad 160 is configured to receive a chip 150 thereon. The chip 150 may comprise any type of integrated circuit that requires temperature control, including CPU, memory chips, laser diode chips, or similar integrated circuit devices as noted above. Chip 150 may, in certain embodiments, comprise a bent waveguide DFB diode chip as described further below. The carrier 100 further includes at least one electrical lead 155, the electrical lead 155 being connected between the second bonding pad 165 and the first bonding pad 160, at least one second electrical lead 157 couples the first bonding pad 160 to chip 150. As show in FIG. 5, the first bonding pad 160 further includes at least one third electrical lead 156, wherein the third electrical lead 157 is coupled the first bonding pad 160 to an electrode (not shown) on the bottom surface of the chip 150, to allow delivery of a drive current to chip 150 in a conventional manner. Additionally, the carrier 100 is configured such that the chip 150 may be mounted in any position. For example, the chip may be mounted right-side up as shown in FIG. 6, or alternatively, the chip may be mounted upside down (not shown).

Figure 6:
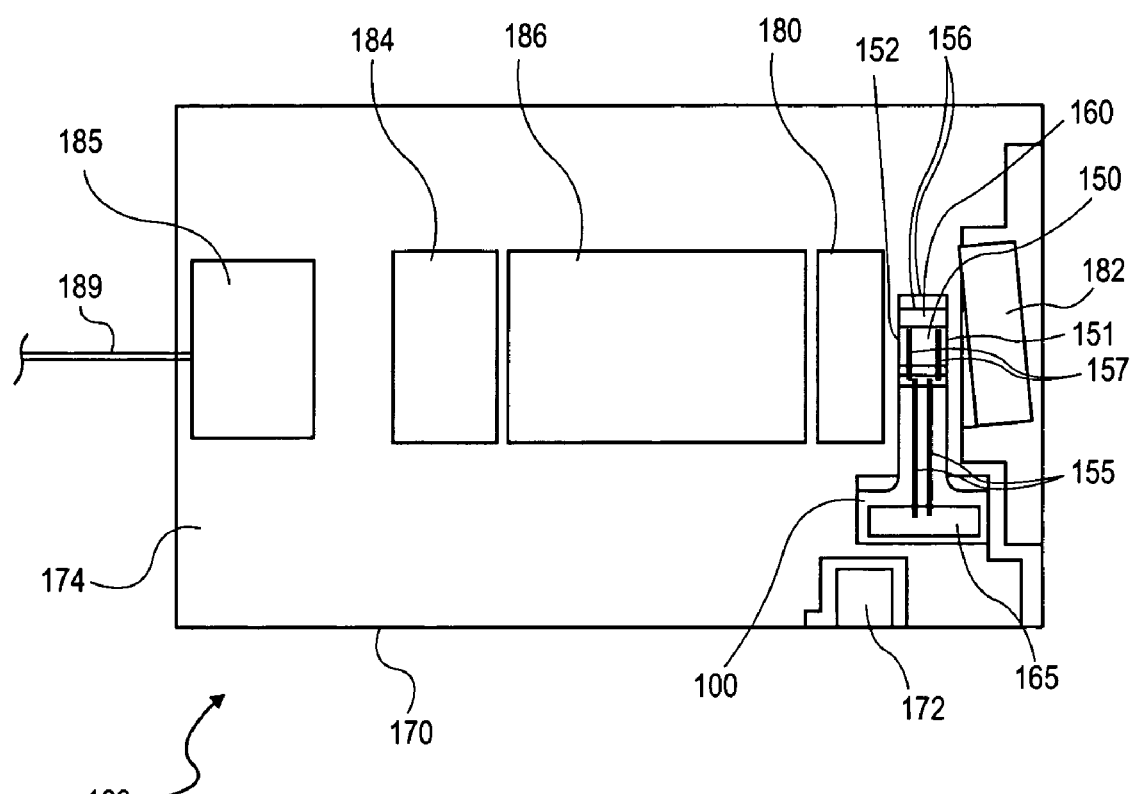
FIG. 6 is a top plan view of the chip carrier and diode chip of FIG. 5 shown on a common platform with an optical output assembly.

Referring now to FIG. 6, there is shown a laser output assembly apparatus 168 in accordance with the invention, with like reference numbers denoting like parts. As shown in FIG. 6, the apparatus includes a thermal control element or module 170. The thermal control module 170 allows for the placement of carrier 100, chip 150 and various laser output optical elements on a common substrate 174. The apparatus comprises a chip 150 with output facets 151 and 152 mounted on carrier 100, collimator lenses 180 and 182, fiber focusing lens 184, a fiber-supporting ferrule 185, an optical isolator 186, and an optical fiber 189. Chip facets 151 and 152, as well as the surfaces of the collimators 180 and 182 and the lens 184, are alignment-sensitive optical surfaces as noted above, and the inclusion of all of these components onto a single thermally controlled substrate 174 allows easy assembly and alignment of the components, and collective temperature control of the components to prevent optical alignment problems due to thermal miss-registration.

The fiber ferule lens 185, fiber focusing lens 184, optical isolator 186 and carrier 100 may be mounted or joined to substrate 174 by a thermally conductive adhesive or solder which may be CTE-matched to each particular component. Chip 150 is joined to the first bonding pad 160 in a similar manner with a thermally conductive adhesive or solder that may be CTE-matched to chip 150 and first bonding pad 160. The first bonding pad 160, fiber ferule lens 185, fiber focusing lens 184, and optical isolator 186 may be structured and configured in a manner which promotes thermal contact with substrate 174. Substrate 174 may likewise include grooves, recesses, or other surface features (not shown), which are configured to optimize thermal contact with the aforementioned components. Various other thermal control considerations known to those skilled in the art may be used in the carrier 100, fiber ferule lens 185, and fiber focusing lens 185 for coupling substrate 174 to the thermoelectric controller 170, and for coupling thermistor 172 to substrate 174 and thermoelectric controller 170.

The T-Bone shaped carrier 100 may be constructed of any thermally conductive material or materials, and may be made of materials having known, selected heat transfer properties. For example the carrier 100 may be constructed of materials such as aluminum, steel, brass, titanium, metal oxide, metal nitride, metal carbide, or alloys or blends, mixtures or composites thereof as noted above, with copper tungsten (CuW) alloy usable in selected embodiments. It again is noted that the list of materials above is only exemplary and should not be considered limiting, and carrier 100 may be constructed of any material with selected thermal conductivity properties. The carrier 100 may be constructed utilizing any standard manufacturing methods, including casting, molding, extruding, or machining. The carrier 100 may have a machined first surface 120 and a machined second surface 122, whereby machining the first and second surfaces ensures that the chip 150 may be received in a substantially level manner thereby ensuring optical alignment. The second surface may also be machined to ensure that the bottom surface 122 of the carrier 100 sits flat against the TEC to achieve maximum thermal conductivity. Additionally, as described above the top and bottom surfaces of the carrier 100 may include geometric features that are configured to enhance heat transfer between components.

Referring again to FIG. 3, during operation of the apparatus 68 a drive current is applied across chip 50, which emits a beam (not shown) from facet 52, which is anti-reflection coated. The beam is collimated by lens 82 and directed to external cavity wavelength selection components (also not shown), which provide optical feedback to chip 50 as described below. Facet 51 outputs another beam (not shown) that is collimated by lens 80 directed through optical isolator 86, and focused into fiber 89 by lens 84. During the pumping of the chip 50, the thermoelectric controller 70 cools substrate 74 to counteract the heat generated by chip 50 during operation. Since chip 50, collimators 80, 82, lens 84 and isolator 86 are thermally coupled to thermoelectric controller 70 via substrate 74, they can be maintained at a constant or substantially constant temperature, thereby preventing mis-alignment or mis-registration of chip 50, collimator 80, lens 84 and isolator 86 due to thermal fluctuation. Cooling of chip 50 during laser operation via substrate 74 and thermoelectric controller 70 also helps avoid thermal degradation and aging of the anti-reflection coating (not shown) on facet 52.

When the apparatus 68 is not in use, chip 50, collimator 80, carrier 10 collimators 80, 82, lens 84 and isolator 86 can be maintained at a constant temperature by thermoelectric controller 70 and substrate 74 so that the various optical surfaces on module 75 are at a higher temperature than any surrounding or adjacent surfaces that are not subject to thermal control. The maintenance of a higher temperature for the components on substrate 74 during power-down periods helps avoid condensation of moisture or volatile organic compounds on important optical surfaces such as chip facets 51, 52 which may otherwise occur if substrate 74 and the components thereon are allowed to cool down. The use of selective heating of optical components of an external cavity laser is also described in U.S. patent application Ser. No. 09/900,423, filed Jul. 6, 2001, the entirety of which is incorporated herein by reference. The apparatus 68 also allows selective control of the temperature of optical isolator 86, and the use of selective heating or cooling of an optical isolator to optimize feedback suppression by an optical isolator is described in U.S. patent application Ser. No. 10/173,513, titled "External Cavity Laser Apparatus and Methods" simultaneously co-filed herewith, the disclosure of which is incorporated herein by reference.

Figure 7:
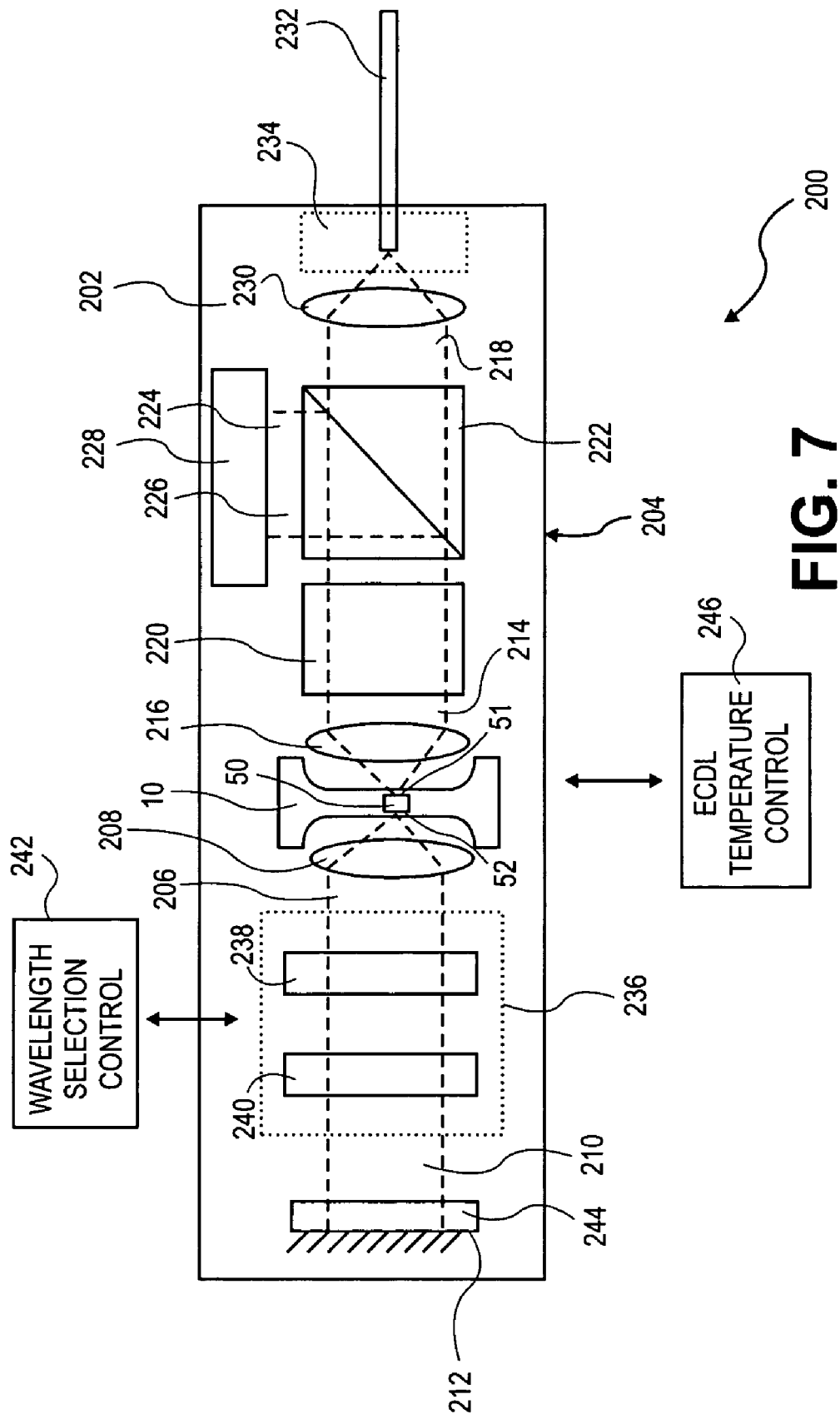
FIG. 7 is a schematic top plan view of an external cavity laser apparatus in accordance with the invention.

Referring now to FIG. 7, there is shown an external cavity laser apparatus 200 in accordance with the invention. The apparatus 200 includes a dog-bone shaped carrier 10 with a laser diode emitter chip 50 thereon as described above. Carrier 10 is mounted on a thermally conductive platform 202, which in turn is mounted on a thermoelectric controller 204 (beneath platform 202) for thermal control of emitter chip 50 as described above. A beam 206 emitted by facet 52 of chip 50 is collimated by lens 208 along optical path 210 to a reflective element 212 that is also mounted on platform 202. Reflective element 212 may comprise a mirror, grating, prism or other reflector or retroreflector. In the embodiment of FIG. 7, facet 51 is partly reflective, and facet 52 is antireflection coated, and an external laser cavity is defined by facet 51 of chip 50 and reflective element 212.

An output beam 214 is emitted from facet 51 of chip 50 and collimated by lens 216 along path 218. Beam 214 passes through an optical isolator 220 to beam splitter 222, which passes a portion of beam 214, and picks off a portion as a test beam 224 along path 226. A photodetector 228 is positioned in test path 226 and is configured to measure output power of test beam 226 during operation of the apparatus 200. Photodetector 228 may be associated with a servo system (not shown) or other control system involved with wavelength tuning of the apparatus 200 as described below. The portion of beam 214 that passes beam splitter 222 is focused by a lens 230 into an optical fiber 232 that is mounted in ferrule 234.

A wavelength selection element 236 is included in the laser apparatus 200 and is shown positioned in optical path 210 between chip 50 and end reflector 212 in the external laser cavity. Wavelength selection element 236 may be coupled to platform 202 and subject to thermal control by thermoelectric controller 204, or may be unsupported by platform 202. In the embodiment shown in FIG. 7, wavelength selection element comprises a pair of etalons 238, 240 that operate as Fabry Perot interference filters to provide feedback to chip 50 along path 210 at a selected wavelength. Etalons may be individually or jointly tuned by thermo-optic, electro-optic, piezo-optic, acousto-optic, mechanical, or other type of tuning mechanism or combination of such tuning mechanisms, to select the wavelength of light that is fed back to chip 50. The use of dual tunable etalons for wavelength selection in this manner is described in U.S. patent application Ser. No. 10/099,649, filed Mar. 15, 2002, the disclosure of which is incorporated herein by reference.

Wavelength selection element 236 may alternatively, or additionally, comprise one or more gratings, prisms or other element or elements that are capable of providing feedback to chip 50 along path 210 at a selected wavelength. The use of mechanically tuned tapered interference filters and wedge-shaped etalons, transmissive and reflective gratings, and electro-optically tuned etalons for wavelength selection is described, for example, in U.S. patent application Ser. No. 09/814,464, filed Mar. 21, 2001. The use of reflective gratings for wavelength selection is also described in U.S. patent application Ser. No. 10/099,730, filed Mar. 15, 2001, the disclosures of which are incorporated herein by reference. The use of thermo-optically tuned etalons and etalons of birefringent material is related in U.S. patent application Ser. No. 10/099,649, filed Mar. 15, 2002, noted above. In embodiments where a reflective grating is used, end reflector 212 may be positioned in a Litmann-Metcalf arrangement to return a selected diffraction back to chip 50. Alternatively, in a Littrow arrangement, end reflector 212 may be omitted, as the grating is positioned to return a selected diffraction directly to chip 50. Other types of wavelength selection elements and tuning mechanisms therefore may suggest themselves to those skilled in the art and are considered to be within the scope of this disclosure.

Wavelength selection element 236 operates to define a single transmission peak within a wavelength range of interest. Such a wavelength range may comprise, for example, the gain bandwidth of emitter chip 50, the "C" telecommunication band, or other wavelength range. The etalons 238, 240 of wavelength selection element 236 provide a finesse such that when wavelength selection element 236 is tuned or adjusted to select a particular wavelength (by adjusting the wavelength of the transmission peak defined by wavelength selection element 236), lasing at other, unselected wavelengths is suppressed. The single transmission peak provided by wavelength selection element 236 thus allows feedback of light at the transmission peak wavelength, while suppressing potential feedback at other wavelengths which may arise due to modes associated with the external cavity defined by facet 52 and end reflector 212, and transmission maxima associated with unselected channels that are provided by grid generator (not shown) that may be used in association with the apparatus 200.

A wavelength selection control element 242 is operatively coupled to wavelength selection element 236 to provide control signals thereto for adjustment or selection of the wavelength of the transmission peak defined by wavelength selection element 236, and hence the wavelength of light that is fed back to chip 50 and ultimately emitted as output along path 218. Wavelength selection control element 242 may be operatively coupled to detector 228 and operable to generate error signals according to optical power levels observed by detector 218 that are usable for adjustment of wavelength selection element 236.

In operation of the laser apparatus 200, current is applied to chip 50 in a conventional manner. The beam 206 emitted from facet 52 of gain medium 24 travels path 210 and passes through or otherwise interacts with wavelength selection element 236. Light at the selected wavelength is returned along path 210 to chip 50 to provide for lasing at the selected wavelength. The output beam 214 from facet 51 is directed along output path 218 through isolator 220 and focused by lens 230 into fiber 232 for use elsewhere.

In the embodiment of FIG. 7, a single platform or substrate 202 supports chip 50 and end reflector 212. Use of a common platform to support the optical components of an external cavity laser imparts vibration stability and facilitates assembly and alignment of the gain medium 24, lens 33 grid etalon 56, wavelength selection control element 50 and end reflector 48, and helps prevent misalignment due to thermal mis-registration as noted above. The use of a common platform for the components of an external cavity laser is also described in U.S. patent application Ser. No. 10/173,571, titled "Micro Optical Bench For Mounting Precision Aligned Optics, Optical Assemblies and Method of Mounting Optics", simultaneously co-filed herewith, the disclosure of which is incorporated herein by reference.

External cavity tuning may be used in the apparatus 200 to provide fine tuning of a selected wavelength via optimizing the relationship of external cavity modes with the transmission peak of wavelength selection element 236. The external cavity modes may be adjusted by physical adjustment of the spacing between facet 26 and end reflector 48, and/or by adjusting the refractive index of material present in the external cavity. End reflector 212 is mounted on a phase compensator element 244 in this regard. Phase compensator element 244 may comprise lithium niobate or other electro-optic material, which has a voltage-dependent refractive index. Selective application of voltage across phase compensator 244 to control refractive index thereof allows tuning of the external cavity optical path length.

Semiconductor gain media materials such as InGaAs and InGaAsP have generally high refractive indices and thus provide an important component of the overall external cavity optical path length. Gain media materials exhibit relatively large changes in refractive index with respect to temperature, and gain medium refractive index adjustment to allow adjustment of external cavity optical path length can be effectively carried out by temperature control of chip 50, which is thermally coupled to thermoelectric controller 204 via thermally conductive platform 202 and thermally conductive carrier 10 as described above. Chip 50 can thus be temperature adjusted, by heating or cooling introduced from thermoelectric controller 204, to adjust the refractive index of the gain medium material of chip 50, and hence external cavity optical path length. A temperature control element 246 may be operatively coupled to thermoelectric controller 204 to provide control signals thereto for selective temperature adjustment of chip 50 for external cavity optical path length adjustment. A thermistor or other temperature sensor (not shown) may be included on platform 202 and operatively coupled to control element 246, to monitor the temperature of platform 202 (and thus chip 50), and if a deviation from a selected temperature is sensed by the thermistor, appropriate corrective temperature adjustment may be made by control element 246 and thermoelectric controller 204.

Both chip 50 and end reflector 212 are mounted on platform 202, and the material of platform 202 may be selected to provide a coefficient of thermal expansion such that heating and cooling of platform 202 provides a corresponding expansion and contraction of platform 202 to adjust the physical separation of facet 51 and end reflector 212, and hence provide adjustment of the external cavity optical path length. The adjustment of the spacing of gain medium facet 51 and end reflector 212 in this manner may be carried out together or simultaneously with the thermal adjustment of chip material refractive index to provide for external cavity optical path length adjustment. The use of temperature control of external cavity optical path length is also described in U.S. patent application Ser. No. 10/173,355, titled "External Cavity Laser Apparatus and Methods", simultaneously co-filed herewith, the disclosure of which is incorporated herein by reference.

Figure 8:
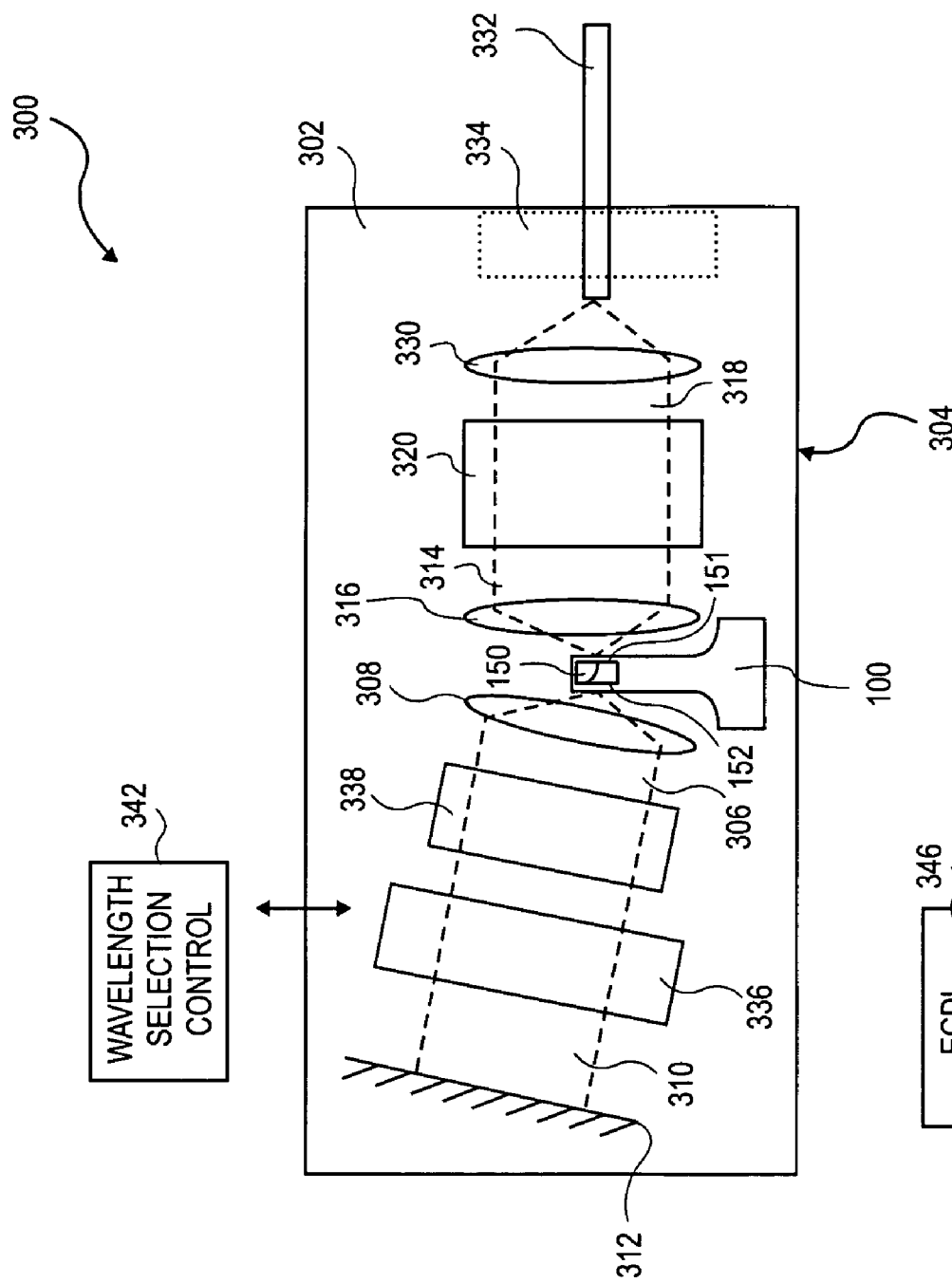
FIG. 8 is a schematic top plan view of another embodiment of an external cavity laser apparatus in accordance with the invention.

Referring now to FIG. 8, another embodiment of an external cavity laser apparatus 300 is shown. The apparatus 300 includes a carrier 100 with a bent waveguide laser diode chip 150 mounted thereon. Carrier 300 is mounted on a thermally conductive substrate 302, which in turn is mounted on a thermoelectric controller 304. A beam 306 emitted by facet 152 of chip 150 is collimated by lens 308 along optical path 310 to a reflective element 312 that is also mounted on platform 302. Reflective element 312 may comprise a mirror, grating, prism or other reflector or retroreflector as noted above. Facet 151 is partly reflective, and facet 152 is antireflection coated, so that an external laser cavity is defined by facet 151 and reflective element 312. An output beam 314 is emitted from facet 151 of chip 150 and is collimated by lens 316 along path 318 to pass through an optical isolator 320, after which beam 314 is focused by lens 330 into an optical fiber 332 mounted in ferrule 334.

The apparatus 300 includes a wavelength selection element 336 shown in this embodiment as a single etalon. A variety wavelength selection elements and tuning or adjustment mechanisms therefore, may be used for wavelength selection element 336 as noted above. The apparatus 300 includes a grid generator, shown as a grid etalon 338 positioned in path 310. Grid etalon 338 may be coupled to platform 302 or unsupported by platform 44. Grid etalon 338 also operates as a Fabry-Perot interference filter with a free spectral range that gives rise to a plurality of transmission peaks that define a wavelength grid of selected channel wavelengths. The wavelength grid may comprise, for example, the ITU (International Telecommunications Union) grid. Other wavelength grids may alternatively be selected according to the configuration of grid etalon. Grid etalon 56 has a finesse (free spectral range divided by full width half maximum or FWHM) that suppresses modes of the external cavity defined by facet 26 and end reflector 48 that are adjacent to channel wavelengths of the wavelength grid. Wavelength selection element 336 has a free spectral range such that it defines a single transmission peak within the wavelength range or grid, and has a finesse such that lasing at unselected transmission wavelengths defined by grid etalon are suppressed.

In operation of the laser apparatus 300, current is applied to chip 150, and beam 306 emitted from facet 152 travels path 310 and passes through or otherwise interacts with wavelength selection element 336 and grid generator 338. Wavelength selection element 336 is tuned by wavelength selection controller 342 so that the transmission peak of wavelength selection element 336 aligns with or otherwise corresponds in wavelength to one of the transmission channels defined by grid generator. Temperature control element 346 controls thermoelectric controller 304 to adjust the temperature of chip 152 and the other components mounted on platform 302. The combined feedback from grid generator 338 and wavelength selection element 336 support lasing at the selected wavelength. The facets 151, 152 of bent waveguide chip 150 result in emitted light beams 306, 314 respectively along paths 310, 318, which are not co-linear due to the configuration of chip 150. This configuration prevents direct reflectance from the surfaces of grid generator 338 and wavelength selection element 336 from returning to chip 150.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. An apparatus, comprising:
 a chip carrier having a Dog-Bone shape formed by:
  a waist section, a transverse end portion on one end of the waist section, a second transverse end portion on a second end of said waist section, a top surface to support a chip, a bottom surface to be coupled to a thermal control element;

a first arcuate portion on a first side of said waist section; and a second arcuate portion on a second side of said waist section, wherein said chip comprises a laser diode chip, wherein said laser diode chip comprises a bent waveguide diode emitter, and wherein the first arcuate portion is to accommodate a first collimator.

2. The apparatus of claim 1, wherein said first surface of said carrier is to couple to a bottom surface of said laser diode chip.

3. The apparatus of claim 1, wherein said first surface of said carrier is to couple to a top surface of said laser diode chip.

4. The apparatus of claim 1, wherein the second arcuate portion is to accommodate a second collimator.

5. The apparatus of claim 1, wherein said top surface is to support said chip adjacent said waist section.

6. A laser apparatus, comprising:

a chip;

a carrier for said chip, said carrier having a Dog-Bone shape formed by a waist section, a first transverse end portion on one end of said waist section, a second transverse end portion on a second end of said waist section, a first arcuate portion on a first side of said waist section, and a second arcuate portion on a second side of said waist section, a first surface to support a gain medium, and a second surface to couple to a thermal control element; and a first collimator located adjacent a first side of said waist section, the first collimator to collimate a first light beam emitted from a first output facet of said chip.

7. The apparatus of claim 6, further comprising a second collimator located adjacent said second side, the second collimator to collimate a second light beam emitted from a second output facet of said chip.

8. The apparatus of claim 6, further comprising a wavelength selection element positioned in said first light beam after said first collimator.

9. The apparatus of claim 8, further comprising a reflective element positioned in said first light beam after said wavelength selection element.

10. The apparatus of claim 7, further comprising an optical isolator positioned in said second light beam after said second collimator.

11. The apparatus of claim 6, wherein said first surface of said carrier is to support said chip adjacent said waist section.

12. The apparatus of claim 11, wherein said chip comprises a laser diode.

13. A method of laser operation, comprising:

emitting a beam from a facet of a gain medium chip, said gain medium chip being mounted on a first surface of a chip carrier, said chip carrier having a Dog-Bone shape formed by a waist section, a first transverse end portion on one end of said waist section, a second transverse end portion on a second end of said waist section, a first arcuate portion on a first side of said waist section, and a second arcuate portion on a second side of said waist section, said chip carrier comprising thermally conductive material; and collimating the beam using a collimator positioned adjacent a first side of said waist section.

14. The method of claim 13, further comprising controlling temperature of said gain medium chip via thermal conduction through said chip carrier.

15. The method of claim 14, wherein said controlling said temperature of said gain medium chip further comprises mounting a second surface of said chip carrier onto a thermally conductive substrate.

16. The method of claim 15, wherein said controlling said temperature of said gain medium chip further comprises coupling said thermally conductive substrate to a thermoelectric controller.

17. The method of claim 13, further comprising:

positioning a wavelength selection element in said beam; and feeding back light of a selected wavelength to said gain medium chip.

* * * * *